United States Patent [19]

Iwata

[11] Patent Number: 4,931,675
[45] Date of Patent: Jun. 5, 1990

[54] SEMICONDUCTOR SENSE AMPLIFIER

[75] Inventor: Yoshihisa Iwata, Kanagawa, Japan

[73] Assignee: Kabushiki Kaisha Toshiba, Kawasaki, Japan

[21] Appl. No.: 934,785

[22] Filed: Nov. 25, 1986

[30] Foreign Application Priority Data

Mar. 5, 1986 [JP] Japan .................................. 61-47691

[51] Int. Cl.$^5$ ..................... H03K 3/356; H03K 3/013; H03K 17/04; H03K 19/01
[52] U.S. Cl. .................................. 307/530; 307/279; 307/291; 365/203; 365/205
[58] Field of Search ............... 307/530, 355, 475, 279, 307/269, 603, 291, 292, 446, 448, 247 R, 272 A; 365/189, 191, 195, 196, 203, 207, 208, 154, 233, 205

[56] References Cited

U.S. PATENT DOCUMENTS

| | | | |
|---|---|---|---|
| 4,417,163 | 11/1983 | Otsuki et al. | 365/203 X |
| 4,442,365 | 4/1984 | Nagami | 307/291 X |
| 4,458,337 | 7/1984 | Takemae et al. | 365/189 |
| 4,542,306 | 9/1985 | Ikeda | 307/272 A X |
| 4,785,206 | 11/1988 | Hoshi | 307/530 |

FOREIGN PATENT DOCUMENTS

60-76087  4/1985  Japan .................................. 307/530
60-37996  8/1985  Japan .................................. 307/530

OTHER PUBLICATIONS

1979 IEEE International Solid State Circuits Conference; "A 80 ns 5 V-Only Dynamic Ram", James M. Lee et al., Feb. 1979; pp 142-143.

*Primary Examiner*—Stanley D. Miller
*Assistant Examiner*—David R. Bertelson
*Attorney, Agent, or Firm*—Foley & Lardner, Schwartz, Jeffery, Schwaab, Mack, Blumenthal & Evans

[57] ABSTRACT

In a semiconductor amplifier of flip-flop address buffer circuit used for dynamic RAM to convert a TTL level address input signal to MOS logic level complementary address signals, a reference signal input section FET to which a mean TTL level signal is always applied is disconnected from the circuit in response to a feedback signal whenever a high-voltage TTL address signal is sensed. Further, the address signal input section is also disconnected from the circuit whenever a low-voltage TTL address signal is sensed. Therefore, power consumption can be reduced and substrate current which results from hot carriers can be reduced, thus resulting in such advantages that fluctuations of threshold level and deterioration in conductance of FETS both due to hot carriers can be prevented to improve the reliability and durability of the buffer circuit.

7 Claims, 6 Drawing Sheets

FIG. 1 (Prior Art)

AT ACTIVE OPERATION

AT ACTIVE OPERATION

FIG.6

SEMICONDUCTOR SENSE AMPLIFIER

BACKGROUND OF THE INVENTION

1. Field of the Invention

The present invention relates generally to a semiconductor sense amplifier and more specifically to an address buffer of flip-flop type for a dynamic RAM, which can convert a TTL (Transistor Transistor Logic) level address input signal to MOS (Metal Oxide Silicon) logic level complementary address signals.

2. Description of the Prior Art

MOS memories are suitable for storing a great number of data. In particular, MOS-type dynamic RAMs have widely been used as the main memory for a computer, because current consumption is extremely small when not activated. In the MOS DRAMs, a sense amplifier is used as a first-stage input circuit. Further, in order to satisfy high speed operation and low power consumption, address buffers of dynamic flip-flop type have widely been used as the sense amplifier. This address better serves to convert a bipolar logic level (TTL) signal to complementary MOS logic level signals. The TTL input signal level can be sensed by the address buffer on the basis of a difference in conductance between an address input FET(Field Effect Transistor) to which a TTL level signal is applied and a reference input FET to which a reference signal (mean TTL level) is applied.

In the prior-art address buffer circuit of sense amplifier, however, since the above two, address input and reference input, FETs are turned on to a TTL level (−1 to 6.5 V, in more detail "L" is −1.0 to 0.8 V and "H" is 2.4 to 6.5 V) different from the MOS level (0 to 5 V), current flows through these FETs, thus increasing power consumption and substrate current. Further, what is worse, an increase in substrate current inevitably causes fluctuations of FET threshold level and deterioration in conductance of the FETs, thus resulting in reduction of sensitivity and long-term reliability of the address buffer circuit.

The circuit configuration of the prior-art address buffer circuit will be described in greater detail hereinafter with reference to the attached drawings under DETAILED DESCRIPTION OF THE PREFERRED EMBODIMENTS.

SUMMARY OF THE INVENTION

With these problems in mind, therefore, it is the primary object of the present invention to provide a semiconductor sense amplifier as of address buffer circuit which can reduce power consumption and improve the reliability of circuit operation.

To achieve the above-mentioned object, the semiconductor sense amplifier of address buffer circuit according to the present invention for converting a TTL level signal to complementary MOS level signals comprises (a) address signal input means for receiving a TTL level address signal; (b) reference signal input means for receiving a reference signal; (c) flip-flop means responsive to the address signal input means and the reference signal input means for latching a voltage level of the TTL level address signal on the basis of a difference in potential between the two input means; (d) feedback means responsive to the flip-flop means for outputting complementary feedback signals; and in particular (e) gate means connected between the reference signal input means and the flip-flop, means for electrically disconnecting the reference signal input means from the flip-flop means in response to one of complementary feedback signals from the feedback means when the flip-flop means is set in response to the TTL level address signal.

In the address buffer circuit according to the present invention, since the reference signal input means operating at a TTL level is electrically disconnected from the circuit in response to a feedback signal whenever a high-voltage level TTL address signal is sensed, it is possible to reduce the power consumption and the substrate current of the reference signal input MOS FET means. The reduction in substrate current will decrease hot carriers, so that it is possible to reduce fluctuations of threshold level and deterioration in conductance of the FET, thus improving the reliability and durability of the address buffer circuit.

BRIEF DESCRIPTION OF THE DRAWINGS

The features and advantages of the sense amplifier as address buffer circuit according to the present invention over the prior-art circuit will be more clearly appreciated from the following description taken in conjunction with the accompanying drawings in which like reference symbols designate similar elements or sections and in which.

DETAILED DESCRIPTION OF THE PREFERRED EMBODIMENTS

To facilitate understanding of the present invention, reference will be made to a prior-art address buffer circuit of N-channel dynamic flip-flop type, which is used for a dynamic RAM as a semiconductor sense amplifier, with reference to the attached drawings.

Figure 1:
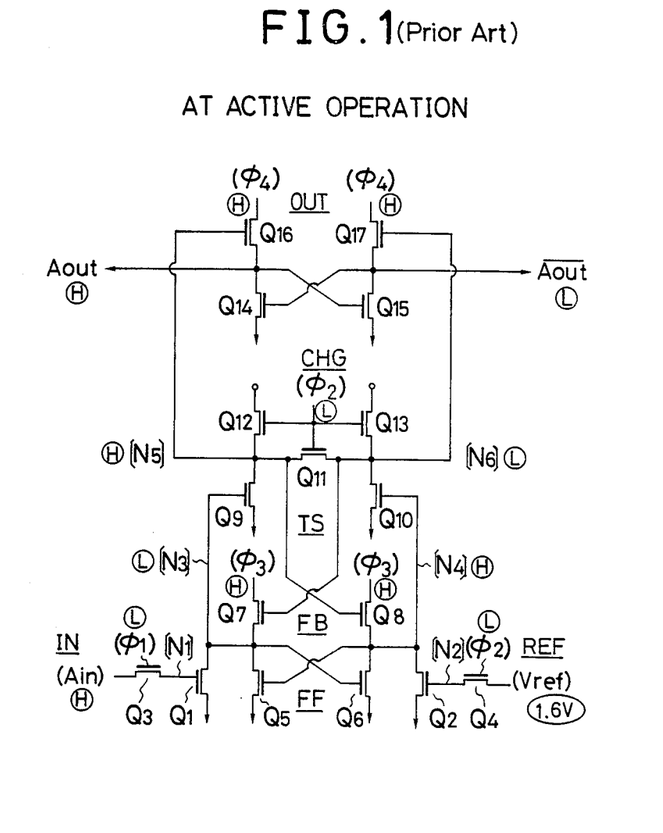
FIG. 1 is a circuit diagram showing a prior-art address buffer circuit.

In FIG. 1, the address buffer circuit is roughly made up of an address signal input section IN ($Q_1$ and $Q_3$), a reference signal input section REF ($Q_2$ and $Q_4$), a flip-flop section FF ($Q_5$ and $Q_6$), a feedback section FB ($Q_7$ and $Q_8$), a transfer section TS ($Q_9$ and $Q_{10}$), a node precharge section CHG ($Q_{11}$, $Q_{12}$ and $Q_{13}$), and an output section OUT ($Q_{14}$ to $Q_{17}$). This address buffer circuit converts a TTL (transistor Transistor Logic) address input signal $A_{in}$ of bipolar logic level into complementary address output signals $A_{out}$ and $\overline{A_{out}}$ of MOS logic level on the basis of comparison of the address signal $A_{in}$ with a reference signal $V_{ref}$. This reference signal potential $V_{ref}$ is set to a mean potential of about 1.6 V between the allowable minimum voltage value of 2.4 V in the high-voltage level (referred to as H-level or "H" simply, hereinafter) of TTL input signals and the allowable maximum voltage value of 0.8 V in the low-voltage level (referred to as L-level or "L" simply, hereinafter) thereof. This is because in TTL level, the H-level is in the 2.4 to 6.5 V range, while the L-level is in the 0.8 to $-1$ V range. On the other hand, in MOS level, the L-level ($V_{SS}$) is 0 V (i.e. ground level) and the H-level $V_{CC}$ (power supply potential) is 5 $\pm 0.5$ V including fluctuations.

With reference to a timing chart shown in FIG. 2, the operation of the address buffer circuit shown in FIG. 1 will be described hereinbelow.

First, reset and precharge operation will be explained on the assumption that an H-level TTL input signal $A_{in}$ is applied to the address signal input section IN. In this condition, clock signals $\phi_1$ and $\phi_2$ are assumed to be at an H-level, and clock signals $\phi_3$ and $\phi_4$ are assumed to be at an L-level. Therefore, the MOS FETs (referred to as transistor hereinafter) $Q_3$ of the address signal input section IN and $Q_4$ of the reference signal input section REF are both on, and the transistors $Q_{11}$, $Q_{12}$ and $Q_{13}$ of the precharge section CHG are all on. As a result, the junction capacitance at the node $N_1$ (i.e. junction point) and the gate capacitance (MOSFET $Q_1$) are charged up to the address input level, while the junction capacitance of the node $N_2$ and the gate capacitance (MOS FET $Q_2$) are charged up to the reference level. Further, the nodes $N_5$ and $N_6$ are both charged up to an H-level because $Q_{12}$ and $Q_{13}$ are turned on. Here, this H-level potential is ($V_{cc}$-$V_{th}$), where $V_{cc}$ denotes a source voltage and $V_{th}$ denotes the threshold voltage (0.6 to 0.8 V) of the transistor. Since the transistors $Q_{11}$, $Q_{12}$ and $Q_{13}$ are on and thereby the nodes $N_5$ and $N_6$ are charged to the H-level, the transistors $Q_7$ and $Q_8$ of the feedback section FB are on and further the transistors $Q_{16}$ and $Q_{17}$ of the output section OUT are also turned on. However, under these conditions, since the clock signals $\phi_3$ and $\phi_4$ are kept at an L-level (ground level), these transistors are not activated, so that the nodes $N_3$ and $N_4$ and the outputs $A_{out}$ and $\overline{A_{out}}$ are also kept at the L-level. As described above, the address buffer circuit is now reset to the ground level or set at all the nodes $N_1$ to $N_6$ and at the outputs $A_{out}$ and $\overline{A_{out}}$. Here, it should be noted that only the nodes $N_5$ and $N_6$ are set to the H-level.

Under these conditions, if the chip turns to an active operation, the nodes $N_4$ and $N_5$ change to the H-level to set only the output $A_{out}$ to the H-level, as will be described below in greater details. First, the clock signals $\phi_1$ and $\phi_2$ change from "H" to "L" and consecutively the clock signal $\phi_3$ also changes from "L" to "H" with a time delay D as depicted in FIG. 2. Therefore, the transistors $Q_3$, $Q_4$ (input section) and $Q_{11}$, $Q_{12}$, $Q_{13}$ (node precharge section) are turned off and consecutively the transisters $Q_7$ and $Q_8$ (feedback section) are turned on to transfer the H-level of the clock $\phi_3$ to the nodes $N_3$ and $N_4$, that is, to change the nodes $N_3$ and $N_4$ from "L" to "H". In this status, since the nodes $N_1$ and $N_2$ are kept at precharged levels enough to turn on the transistors $Q_1$ and $Q_2$, respectively and additionally there exists a difference in voltage level between the nodes $N_1$ and $N_2$, a difference in conductance develops between two transistors $Q_1$ and $Q_2$; that is, a potential difference occurs between the two nodes $N_3$ and $N_4$. Here, the conductance of an FET can be expressed as $$g_m = I_{DS}/V_{GS}$$

where $V_{GS}$ denotes the gate (gate-source) voltage (i.e. input voltage) and $I_{DS}$ denotes the drain (drain-source) current (i.e. output current).

Figure 2:
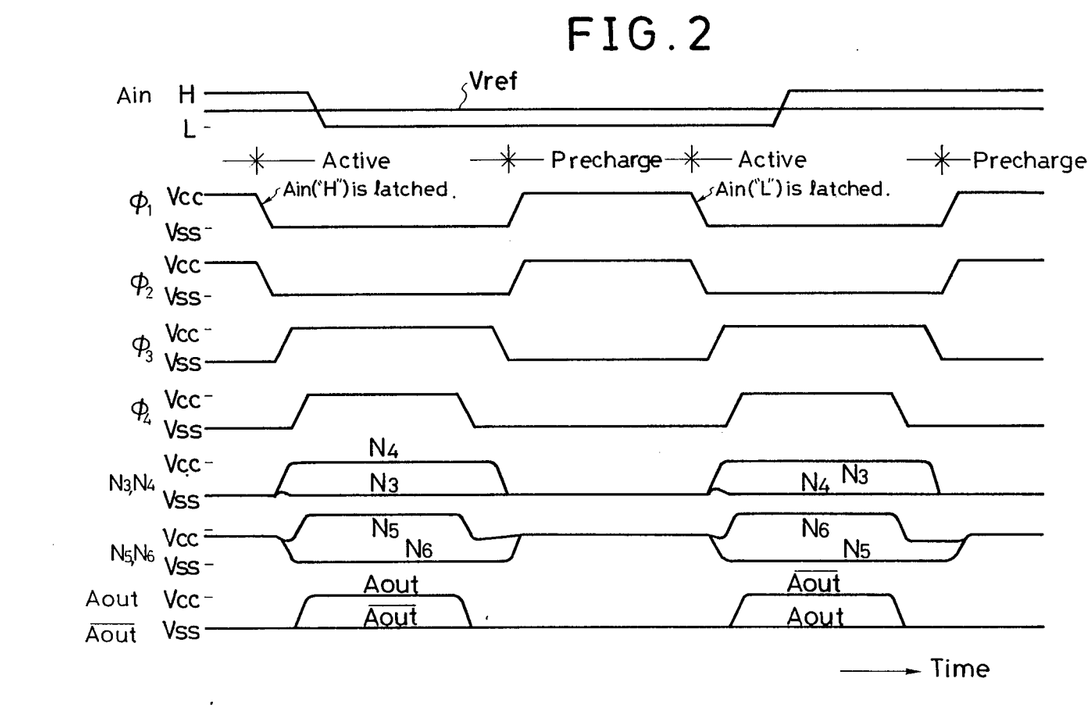
FIG. 2 is a timing chart for assistance in explaining the operation of the address buffer circuit shown in FIG. 1.

Here, since the address input signal $A_{in}$ is at the H-level higher than $V_{ref}$, the flip-flop section FF of $Q_5$ and $Q_6$ is latched with the node $N_4$ at "H" and the node $N_3$ at "L", as shown in FIG. 2.

In this state; $Q_5$ is on, and $Q_6$ is off. Simultaneously, this potential difference is transferred to the nodes $N_5$ and $N_6$ via the transistars $Q_9$ and $Q_{10}$ of the transfer section TS. That is, since the potential is "H" at $N_4$ and "L" at $N_3$, the transistor $Q_9$ is turned off but $Q_{10}$ is turned on, so that the node $N_5$ is kept at an H-level ($V_{cc}$-$V_{th}$) but the node $N_6$ drops to the L-level (ground). Since the nodes $N_5$ and $N_6$ are connected to the gate of each of the transistors $Q_8$ and $Q_7$ of the feedback section FB, respectively, when the node $N_6$ changes to "L", the conductance of the transistor $Q_7$ decreases, so that the difference in voltage level between two node $N_3$ (at "L") and $N_4$ (at "H") further increases. Owing to this positive feedback operation, potential changes to the L-level at the nodes $N_3$ and $N_6$, but to the H-level at the nodes $N_4$ and $N_5$.

Thereafter, when the clock signal $\phi_4$ changes from "L" to "H", since the node $N_5$ is at "H" and the node $N_6$ is at "L", the transistor $Q_{16}$ is turned on but the transistor $Q_{17}$ is turned off in the output section OUT. Therefore, the output $A_{out}$ changes to "H" and the output $\overline{A_{out}}$ changes to "L". That is to say, two complementary output signals $A_{out}$ ("H") and $\overline{A_{out}}$ ("L") are outputted from this address buffer circuit, in response to the address input signal $A_{in}$ ("H"), by converting the TTL level to the MOS level.

In the prior-art address buffer circuit as described above, however, there exist some shortcomings as follows:

(1) The potential of the address input signal $A_{in}$ or the reference signal $V_{ref}$ applied to each of gates of the transistors $Q_1$ and $Q_2$ does not correspond to MOS level at which the transistor is substantially turned off. Therefore, the transistors $Q_1$ and $Q_2$ are always kept at the conductive state, excepting that the L-voltage level of TTL input signals allows the transistor $Q_1$ to be nonconductive. Therefore, as long as the clock signal $\phi_3$ is kept at "H" level, a current flows through the transistor $Q_2$ via the "transistor $Q_8$ where the address input signal $A_{in}$ is at the H-level, and through the transistor $Q_1$ via the transistor $Q_7$ where $A_{in}$ is at the L-level, thus resulting in a problem in that the current consumption increases. In other words, the transistor $Q_2$ (when $A_{in}$ is at "H") or the transistor $Q_1$ (when $A_{in}$ is at "L") operates in pentode fashion, that is, within the saturation region, as long as the clock signal $\phi_3$ is at "H". Further, in this case, a larger current flows through $Q_2$ as compared with that flowing through $Q_1$, and therefore a rise time from "L" to "H" at the node $N_4$ is long, thus reducing the switching speed of the flip-flop ($Q_5$ and $Q_6$).

Figure 3:
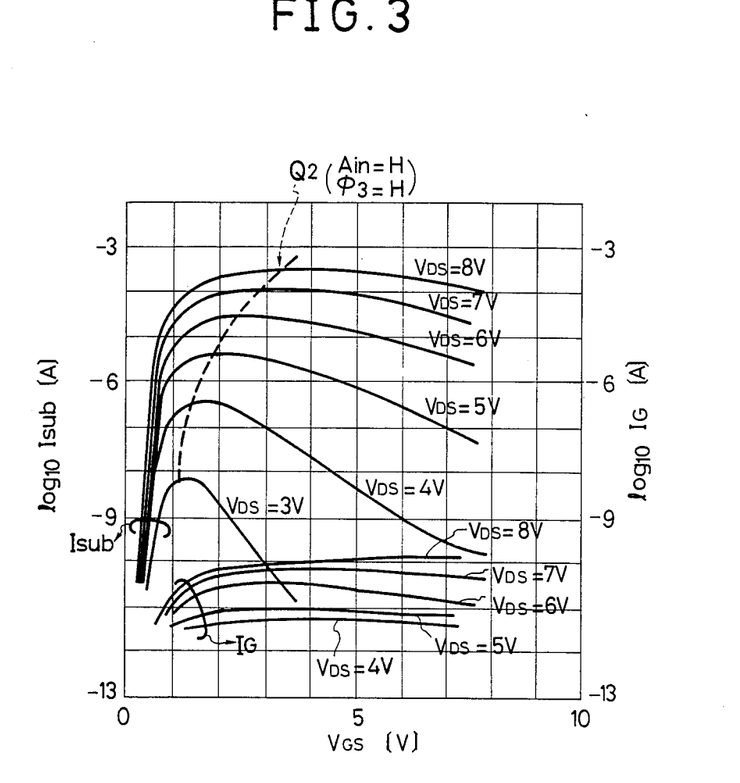
FIG. 3 is a graphical representation showing the relationship between gate voltage $V_{GS}$ and substrate current $I_{sub}$ and that between $V_{GS}$ and gate current $I_G$ with drain voltage $V_{DS}$ as parameter in a FET with a 1.2 μm-long and 20-μm wide gate.

(2) FIG. 3 shows the relationship between $V_{GS}$ (gate-source voltage) and $I_G$ (gate current), that is, gate input characteristics and the relationship between $V_{GS}$ and $I_{sub}$ (substrate current) with $V_{DS}$ (drain-source voltage) as parameter in a MOS FET with a gate width of 20 $\mu$m and a gate length of 1.2 $\mu$m. In FIG. 3, the dashed curved line indicates how the $V_{GS}$ and $V_{DS}$ of the transistor $Q_2$ changes in response to the H-level $A_{in}$ when the buffer circuit is operating in a stable active state and the supply voltage $V_{cc}$ changes from 4 to 9 V. FIG. 3 indicates that the transistor $Q_2$ operates in a region at which the substrate current $I_{sub}$ is at its maximum when the drain voltage $V_{DS}$ varies from 3 to 8 V. In other words, $Q_2$ operates at such a drain voltage ($V_{DS}$) and gate voltage ($V_{GS}$) that the substrate current ($I_{sub}$) becomes the maximum.

Figure 4:
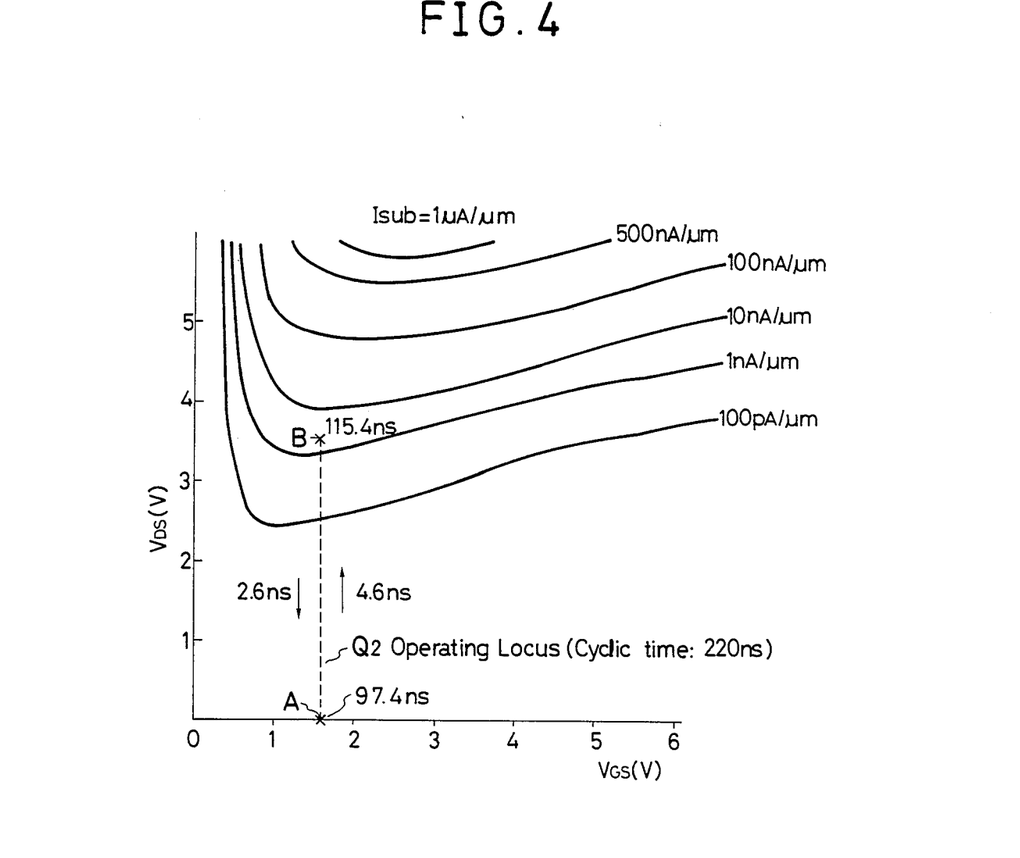
FIG. 4 is a graphical representation showing the relationship between $V_{GS}$ and $V_{DS}$ with $I_{sub}$ as parameter in the same FET.

FIG. 4 shows the relationship between $V_{GS}$ (gate-source voltage) and $V_{DS}$ (drain-source voltage), that is, drain output characteristics with the substrate current per unit gate width (one μm) as parameter in the same MOS FET. The dashed line indicates how the $V_{GS}$ and $V_{DS}$ of the transistor $Q_2$ change instantaneously when the buffer circuit is operating. The point B ($V_{DS}=3.7$ V) is a stable point at which the buffer circuit is in an active state in response to the H-level $A_{in}$, while the point A ($V_{DS}=0$ V) is a stable point at which the buffer circuit is an active state in response to the L-Level $A_{in}$ or the buffer circuit is in the precharge state. That is, the dashed line indicates an operation locus of $Q_2$. When $\phi_3$ is at "L", $V_{DS}$ of $Q_2$ is 0 V and $V_{GS}$ thereof is 1.6 V ($V_{ref}$) for 97.4 ns at point A; however, when o3 is at "H" and $A_{in}$ is also at "H", since $N_4$ rises to "H", $V_{DS}$ of $Q_2$ is about 3.5 V for 115.4 ns at point B. Therefore, at point B, $Q_2$ stays for as long as 115.4 ns in a large substrate current region of about 2 to 3 nA/μm. Further, this locus indicates that the transition time is 4.6 ns from point A to point B and 2.6 ns from point B to point A, so that a cyclic time of $Q_2$ is 220 ns in total by adding all the duration times (where the circuit shown in FIG. 1 is applied to an NMOS 1M bit DRAM).

The above-mentioned substrate current is caused by hot carriers of relatively high energy in the device. Therefore, it is possible to consider the magnitude of substrate current as an index of the quantity of hot carriers. Further, it has been reported that hot carriers cause fluctuations of the threshold level and deterioration in the conductance. In this address buffer circuit, address input signal $A_{in}$ can be sensed on the basis of a difference in conductance between the transistor $Q_1$ having a gate to which address signals $A_{in}$ are applied and the transistor $Q_2$ having a gate to which a reference potential signal $V_{ref}$ is applied. Therefore, in case the threshold value fluctuates or the conductance is deteriorated, there exist problems in that the sensitivity of the circuit is lowered and a long-term reliability thereof is not expected.

In view of the above description, reference is now made to an embodiment of the sense amplifier of address buffer circuit according to the present invention. The feature thereof is to further provide two transmission gate circuits to automatically disconnect the two transistors $Q_1$ and $Q_2$ from the other sections in dependence upon the internal conditions under positive feedback control.

Figure 5:
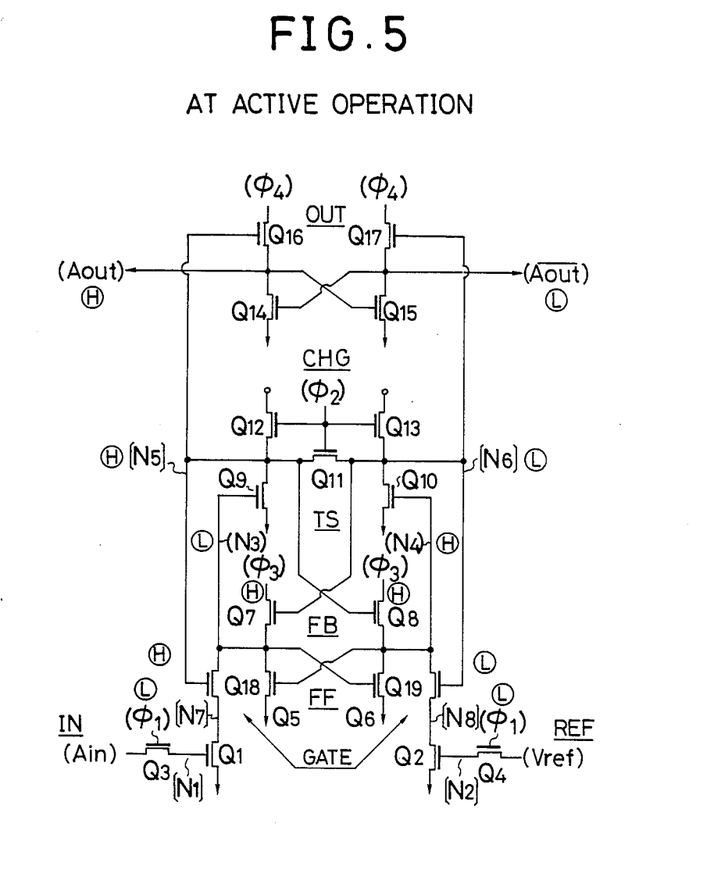
FIG. 5 is a circuit diagram showing the address buffer circuit according to the present invention.

FIG. 5 shows an embodiment of the present invention. The address buffer circuit of flip-flop sense amplifier shown in FIG. 5 is substantially the same in circuit configuration as the prior art address buffer circuit except a transmission gate section GATE having transistors $Q_{18}$ and $Q_{19}$. Therefore, the same reference symbols have been retained for similar elements which have the same functions without repeating the description of them.

In FIG. 5, a transistor (MOS FET) $Q_{18}$ is connected between the address signal input section ($Q_1$ and $Q_3$) IN and the flip-flop section ($Q_5$ and $Q_6$) FF, while a transistor $Q_{19}$ is connected between the reference signal input section ($Q_2$ and $Q_4$) REF and the flip-flop section FF. With the transistor $Q_{18}$, the gate thereof is connected to the node $N_5$; the drain thereof is connected to the node $N_3$ of a first input/output terminal; and the source thereof is connected to the drain of the transistor $Q_1$. On the other hand, with the transistor $Q_{19}$, the gate thereof is connected to the node $N_6$; the drain thereof is connected to the node $N_4$ of a second input/output terminal; and the source thereof is connected to the drain of the transistor $Q_2$. The operation of this buffer circuit is the same as described with reference to the timing chart shown in FIG. 2.

In the address buffer circuit shown in FIG. 5, the gates of transistors $Q_7$ and $Q_{19}$ are connected to the node $N_6$, while the gates of transistors $Q_8$ and $Q_{18}$ are connected to the node $N_5$. Therefore, the transistors $Q_7$ and $Q_{19}$ operate in complementary operational relationship to the transistors $Q_8$ and $Q_{18}$, whenever clock $\phi_3$ changes from "L" to "H". In other words, when $N_4$ at "H", $N_3$ is at "L", so that $Q_{19}$ is turned off when $Q_{18}$ is on. In other words, the two transistors operate in complementary fasion.

The advantageous operation of this address buffer circuit according to the present invention will be described hereinbelow. With reference to FIG. 2 again, when the address input $A_{in}$ is at "H" in the active operation, the potential at the node $N_6$ is at "L" to turn off the transistor $Q_{19}$. Therefore, no current flows through the transistor $Q_2$ even if the transistor $Q_2$ is in conductive status, so that the power consumption is reduced and the already-mentioned problems (fluctuations of threshold level and deterioration in conductuace) due to hot carriers can perfectly be settled.

In addition, in the prior-art address buffer circuit shown in FIG. 1, the potential at the Node $N_3$ or $N_4$ tends to be lowered through the transistor $Q_1$ or $Q_2$, in particular through $Q_2$ (because the conductive of $Q_2$ is large when $N_4$ is at "H" as compared with that of $Q_1$ when $N_3$ is at "H"). Therefore, the speed of potential change, or a rise in voltage from "L" to "H" is slow at the node $N_4$. However, in the address buffer according to the present invention, no discharge path is formed at the "H"-level side node $N_3$ or $N_4$ owing to the presence of two transistors $Q_{18}$ and $Q_{19}$ and therefore the rise time of potential is short at the nodes $N_3$ or $N_4$; as a result, the operating speed of the circuit increases markedly.

Figure 6:
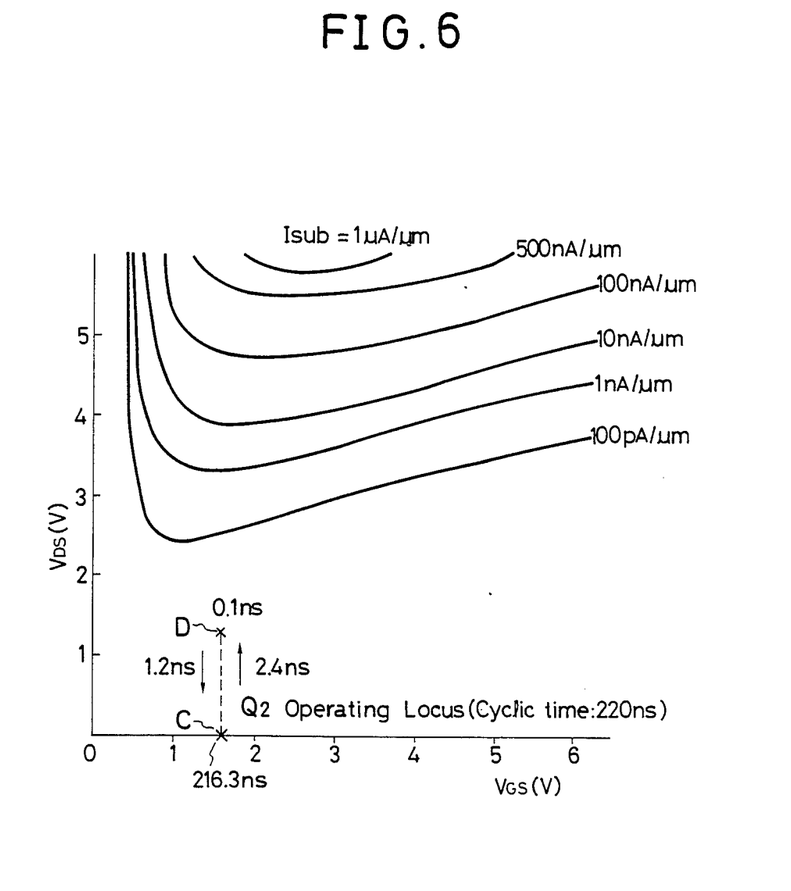
FIG. 6 is a graphical representation similar to FIG. 4, in which an advantageously low substrate current of the circuit of the present invention is shown by the dashed line in comparison with that shown in FIG. 4.

FIG. 6 is a graphical representation similar to FIG. 4. The dashed line indicates an operation locus of $Q_2$ shown in FIG. 5. When $\phi_3$ is at "L", $V_{DS}$ of $Q_2$ is 0 V and $V_{GS}$ thereof is 1.6 V ($V_{ref}$) for 216.3 ns at point C. When $\phi_3$ is at "H" and $A_{in}$ is also at "H", since $N_6$ drops to "L" (see FIG. 2), even if $N_4$ rises to "H", $Q_{19}$ is turned off, so that $V_{DS}$ of $Q_2$ stays at about 1.3 V for as short as 0.1 ns at point D, without passing a current through $Q_2$. It should be noted that at this point D the substrate current is low as compared with that at point B in FIG. 4. Further, this locus indicates that the transition time is 2.4 ns from point C to point D and 1.2 ns from point D to point C, so that the cyclic time of $Q_2$ is 220 ns in total in the same way as in FIG. 4 (when applied to an NMOS 1M bit DRAM).

In the address buffer circuit shown in FIG. 5, the transistors $Q_{11}$, $Q_{12}$ and $Q_{13}$ are connected to form a node precharge section and the transistors $Q_{14}$, $Q_{15}$, $Q_{16}$ and $Q_{17}$ are provided to form an output section for outputting a pair of complementary output signals $A_{out}$ and $\overline{A_{out}}$. However, the circuit configuration of these node precharge section and the output section can be modified in various way to provide the same function.

Further, the source of each of the transistors is directly grounded in FIG. 5. Without being limited to this, however, is also possible to connect the common junction points of these transistors to the ground via a transfer gate transistor.

Furthermore, the address buffer circuit according to the prevent invention has been described on the basis of N-channel MOS FETs of enhancement type. However, without being limited to the FETs of this type, P-channel MOS FETs of the same type or N-or P-channel MOS FETs of depletion device are also of course available.

What is claimed is:

1. A semiconductor sense amplifier of address buffer circuit for converting a TTL level signal to complementary MOS level signals, comprising:
   (a) address signal input means responsive to a TTL level address signal;
   (b) reference signal input means responsive to a reference signal;
   (c) flip-flop means connected to said address signal input means and said reference signal input means for latching a voltage level of the TTL level address signal on the basis of a difference in potential between said address signal input means and said reference signal input means;
   (d) feedback means connected to said flip-flop means for outputting complementary feedback signals;
   (e) first gate means connected between said reference signal input means and said flip-flop means for disconnecting said reference signal input means from said flip-flop means in response to a complementary feedback signal from said feedback means, whenever said flip-flop means is set in response to the TTL level address signal; and
   (f) second gate means connected between said address signal input means and said flip-flop means for realizing a complementary circuit configuration.

2. A semiconductor sense amplifier of address buffer circuit for converting a TTL level signal to complementary MOS level signals, which comprises:
   (a) address signal input means for receiving high- and low-voltage level TTL address signals;
   (b) reference signal input means for receiving a reference signal representative of a mean TTL level indicative of an intermediate level between "H" and "L" in TTL level;
   (c) precharge means for precharging said address signal input means to an address signal level and said reference signal input means to the mean TTL level;
   (d) flip-flop means connected to said address signal input means and said reference signal input means for latching a high-voltage or a low-voltage TTL level address signal on the basis of a difference in potential between the address signal level and the mean TTL level;
   (e) feedback means connected between said precharge means and said flip-flop means for generating complementary feedback signals whenever said flip-flop means is set or reset;
   (f) first gate means connected between said reference signal input means and said flip-flop means for disconnecting said reference signal input means from said flip-flop means in response to a complementary feedback signal generated from said feedback means whenever said flip-flop means is set to detect a high-voltage level address signal; and
   (g) second gate means connected between said address signal input means and said flip-flop means for realizing a complementary circuit configuration in relation to said first gate means.

3. A semiconductor sense amplifier of address buffer circuit for converting a TTL level signal to complementary MOS level signals, which comprises:
   (a) a first transistor $Q_1$ for receiving a TTL level address signal, said first transistor being precharged to an address input signal level in response to a first clock $\phi_1$ when the address signal is at a high-voltage level;
   (b) a second transistor $Q_2$ for receiving a reference signal representative of a mean TTL level indicative of an intermediate level between "H" and "L" in TTL level, said second transistor being precharged to a reference signal level in response to the first clock $\phi_1$;
   (c) third and fourth flip-flop transistors $Q_5$ and $Q_6$ connected between said first and second transistors $Q_1$ and $Q_2$ for latching a potential difference between the address input signal level and the reference signal level in response to a second clock $\phi_3$;
   (d) fifth and sixth transistors $Q_7$ and $Q_8$ connected to said flip-flop transistors for complementarily applying a positive feedback signal to said flip-flop transistors; and
   (e) a seventh transistor $Q_{19}$ connected between said second transistor $Q_2$ and said fourth flip-flop transistor $Q_6$ for disconnecting said second transistor $Q_2$ from said fourth flip-flop transistor $Q_6$ in response to a complementary feedback signal applied from said fifth transistor $Q_7$.

4. The semiconductor sense amplifier as set forth in claim 3, which further comprises an eighth transistor $Q_{18}$ connected between said first transistor $Q_1$ and said third transistor $Q_5$.

5. The semiconductor sense amplifier as set forth in claim 4, which further comprises ninth, tenth and eleventh transistors $Q_{11}$, $Q_{12}$ and $Q_{13}$ connected to said seventh and eighth transistors $Q_{18}$ and $Q_{19}$ for precharging said transistors $Q_{18}$ and $Q_{19}$ in response to a third clock $\phi_2$.

6. The semiconductor sense amplifier as set forth in claim 5, which further comprises twelfth and thirteenth transistors $Q_9$ and $Q_{10}$ connected between said tenth and eleventh transistors $Q_{12}$ and $Q_{13}$ and ground for transferring a latched status of said flip-flop transistors $Q_5$ and $Q_6$.

7. The semiconductor sense amplifier as set forth in claim 6, which further comprises fourteenth and fifteenth transistors $Q_{16}$ and $Q_{17}$ for outputting complementary MOS level address signals in response to complementary signals transferred from said twelfth and thirteenth transistor $Q_9$ and $Q_{10}$.

* * * * *